United States Patent
Mukai et al.

(10) Patent No.: US 8,436,568 B2
(45) Date of Patent: May 7, 2013

(54) MOTOR DRIVE APPARATUS AND ELECTRIC POWER STEERING SYSTEM USING THE SAME

(75) Inventors: Yasuhiko Mukai, Anjo (JP); Hideki Kabune, Nagoya (JP)

(73) Assignee: Denso Corporation, Kariya (JP)

( * ) Notice: Subject to any disclaimer, the term of this patent is extended or adjusted under 35 U.S.C. 154(b) by 214 days.

(21) Appl. No.: 13/134,023

(22) Filed: May 26, 2011

(65) Prior Publication Data

US 2011/0290580 A1     Dec. 1, 2011

(30) Foreign Application Priority Data

May 28, 2010  (JP) .................................. 2010-122420

(51) Int. Cl.
    *H02P 6/12*     (2006.01)
    *B62D 5/04*     (2006.01)

(52) U.S. Cl.
    USPC ................. 318/490; 318/400.01; 318/400.22; 318/400.3; 318/434; 180/443; 180/446; 374/45

(58) Field of Classification Search ............. 318/434, 318/490, 400.01, 400.22, 400.3; 180/443, 180/446; 374/45
    See application file for complete search history.

(56) References Cited

U.S. PATENT DOCUMENTS

| | | | |
|---|---|---|---|
| 4,765,426 A * | 8/1988 | Shimizu | 180/446 |
| 4,940,102 A * | 7/1990 | Morishita | 180/446 |
| 6,182,807 B1 * | 2/2001 | Saito et al. | 191/2 |
| 6,271,637 B1 * | 8/2001 | Kushion | 318/434 |
| 6,401,891 B1 * | 6/2002 | Saito et al. | 191/2 |
| 6,408,998 B1 * | 6/2002 | Saito et al. | 191/2 |
| 6,479,973 B2 * | 11/2002 | Saito et al. | 323/282 |
| 6,582,119 B2 * | 6/2003 | Mori et al. | 374/45 |
| 6,727,669 B2 * | 4/2004 | Suzuki et al. | 318/139 |
| 6,769,521 B2 * | 8/2004 | Saito et al. | 191/2 |
| 6,833,713 B2 * | 12/2004 | Schoepf et al. | 324/536 |
| 7,028,819 B2 * | 4/2006 | Saito et al. | 191/2 |
| 7,791,293 B2 * | 9/2010 | Nagase et al. | 318/400.01 |
| 7,908,057 B2 * | 3/2011 | Sawada et al. | 701/43 |
| 2001/0028241 A1 * | 10/2001 | Saito et al. | 323/282 |
| 2001/0038661 A1 * | 11/2001 | Mori et al. | 374/45 |
| 2002/0043964 A1 * | 4/2002 | Saito et al. | 323/282 |

(Continued)

FOREIGN PATENT DOCUMENTS

| | | |
|---|---|---|
| JP | 07-033033 | 2/1995 |
| JP | 09-222448 | 8/1997 |
| JP | 2008-44451 | 2/2008 |

OTHER PUBLICATIONS

Office Action dated Apr. 13, 2012 in corresponding Japanese Application No. 2010-122420.

*Primary Examiner* — Paul Ip

(74) *Attorney, Agent, or Firm* — Harness, Dickey & Pierce, PLC

(57) ABSTRACT

A motor drive apparatus includes a control circuit, which determines that a wire connecting a battery to a first power supply relay and a second power supply relay is broken, and not failure of the power supply relays, if power is not supplied to a motor from the power supply relays when the power supply relays are controlled to turn on. The location of failure can thus be specified accurately. It is only necessary in this case to replace the wire. The motor drive apparatus need not be disassembled or investigated in detail. Man-power for specifying the failure location can be reduced.

6 Claims, 6 Drawing Sheets

U.S. PATENT DOCUMENTS

| | | | |
|---|---|---|---|
| 2003/0001434 A1* | 1/2003 | Saito et al. | 307/10.1 |
| 2003/0071587 A1* | 4/2003 | Suzuki et al. | 318/139 |
| 2003/0193308 A1* | 10/2003 | Richardson et al. | 318/700 |
| 2004/0150410 A1* | 8/2004 | Schoepf et al. | 324/536 |
| 2005/0179448 A1* | 8/2005 | Kirchner et al. | 324/686 |
| 2008/0006469 A1* | 1/2008 | Sasaki et al. | 180/428 |
| 2008/0017439 A1* | 1/2008 | Sawada et al. | 180/446 |
| 2009/0079373 A1* | 3/2009 | Nagase et al. | 318/400.22 |
| 2011/0127936 A1* | 6/2011 | Ogasawara | 318/400.3 |

* cited by examiner

MOTOR DRIVE APPARATUS AND ELECTRIC POWER STEERING SYSTEM USING THE SAME

CROSS REFERENCE TO RELATED APPLICATION

This application is based on and incorporates herein by reference Japanese patent application No. 2010-122420 filed on May 28, 2010.

FIELD OF THE INVENTION

The present invention relates to a motor drive apparatus for driving a motor and an electric power steering system using the same.

BACKGROUND OF THE INVENTION

As a system for assisting vehicle steering operation, an electric power steering system, which operates electrically to generate torque, is provided. An electric power steering system disclosed in, for example, JP 2008-44451A has an electric motor for applying steering assist force to a steering system, a motor drive circuit for driving a motor, a power supply relay circuit for supplying electric power from a battery to the motor drive circuit, and the like. The electric power steering system determines abnormality in a power supply path by monitoring a voltage level appearing at a side, which is connected to a power stabilizing capacitor in the power supply relay circuit.

A wire-break failure in the power supply path includes two cases, in one of which the power supply relay cannot be turned on and in the other of which a wire between a power source and the power supply relay is broken. According to JP 2008-44451A, it is checked whether the relay has an open-failure or a battery power supply wire has a wire-break based on whether the voltage level at the side connected to the power stabilizing capacitor of the power supply relay circuit rises. It is therefore necessary to monitor rise of the voltage level for a period of time to check whether the battery power supply wire has the wire-break or the power supply relay has the open-failure.

SUMMARY OF THE INVENTION

It is therefore an object of the present invention to provide a motor drive apparatus, which is capable of specifying a location of wire-break failure.

According to one aspect of the present invention, a motor drive apparatus is provided for driving a motor having a plurality of coil sets. The motor drive apparatus includes a plurality of inverter circuits provided for each of the coil sets for supplying electric power from a power source to the coil sets, a plurality of shut-off circuits connected to the power source through a power supply wire and to the inverter circuits for shutting off the power supply from a power source side to inverter circuit sides, and a control circuit including a switching control part, a conduction state check part and a wire-break determination part. The switching control part controls switching-over of conduction and shut-off of the shut-off circuits. The conduction state check part checks whether the power is supplied to a motor side from shut-off circuits side with respect to each of the shut-off circuits. The wire-break determination part determines that the wire between the. power source and the shut-off circuits is broken, if more than a predetermined number of the shut-off circuits are determined to fail to supply power to the motor side, when the plurality of shut-off circuits are controlled to turn on by the switching control part.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE EMBODIMENT

A motor drive apparatus according to the present invention and an electric power steering (EPS) system using the motor drive apparatus are described below with reference to the accompanying drawings.

(First Embodiment)

Figure 1:
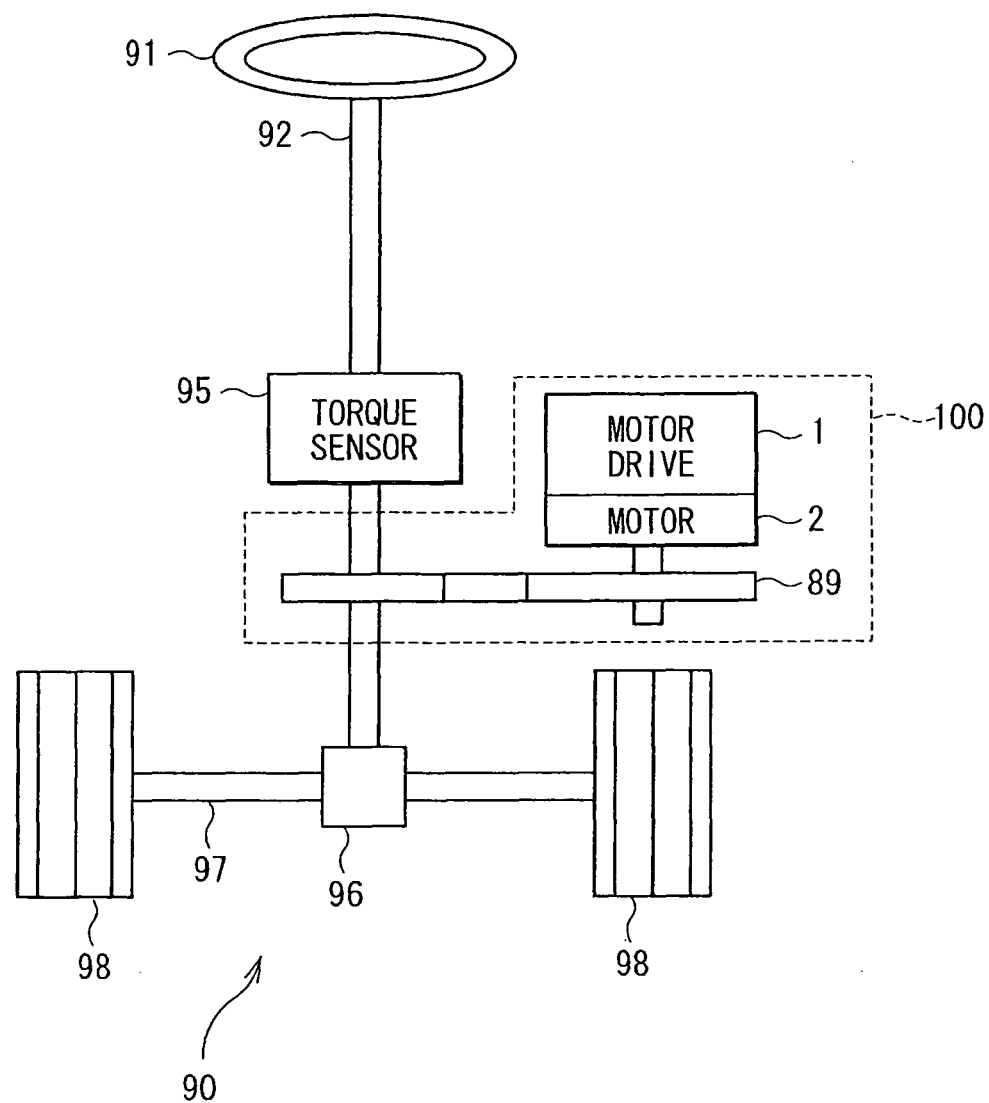
FIG. 1 is a schematic diagram of an electric power steering system according to a first embodiment of the present invention.

An electric power steering system according to a first embodiment of the present invention is shown in FIG. 1, which shows entirety of an electric power steering system.

An electric power steering system 100 is provided in a steering system 90 of a vehicle. In this system, a steering sensor (not shown in FIG. 1) and a torque sensor 95 are provided to a steering shaft 92 of a steering wheel 91. The steering sensor is for detecting a rotation angle of the steering shaft 92. The torque sensor 95 is for detecting a steering torque applied to the steering wheel 91. One axial end of the steering shaft 92 is coupled to a rack shaft 97 through a gear 96. A pair of tires (wheels) 98 is coupled to both ends of the rack shaft 97 through tie rods and the like. The rotational motion of the steering shaft 92 is thus translated to the linear motion of the rack shaft 97 by the gear 96, and the tires 98 at left and right are steered by an angle corresponding to an amount of linear motion of the rack shaft 97.

The electric power steering system 100 includes a motor 2 as an electric motor for generating steering assist torque, a motor drive apparatus 1 for driving the motor 2, a rotation sensor (not shown) for detecting a rotation angle of the motor 2, and a gear 89 for transferring rotation of the motor 2 to the steering shaft 92 by reducing the rotation speed of the motor 2. The motor 2 is a three-phase brushless motor, which drives the gear 89 in forward and reverse directions. The electric power steering system 100 transfers to the steering shaft 92 steering assist torque, which corresponds to steering direction and steering torque of the steering wheel 91. The motor 2 has a stator, a rotor and a shaft, which are not shown. The rotor is disk-shaped to rotate with the shaft. Permanent magnets are attached to a peripheral surface of the rotor to provide magnetic poles. The stator internally accommodates and rotatably supports the rotor. The stator has protrusions, which protrude in the radially inward direction and are spaced apart a predetermined angle in a circumferential direction.

Figure 2:
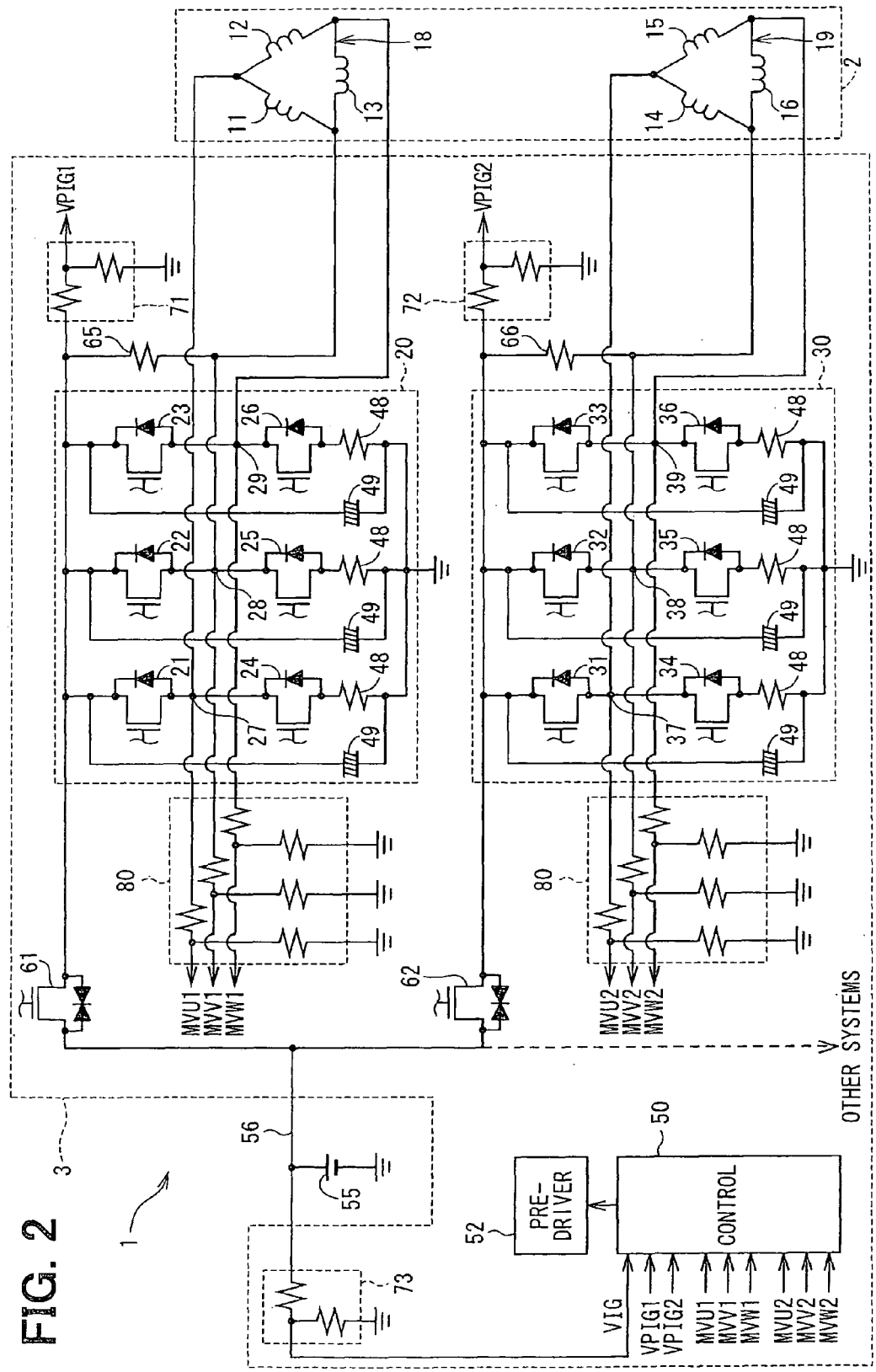
FIG. 2 is a circuit diagram of a motor drive apparatus according to the first embodiment of the present invention.

As shown in FIG. 2, a U1 coil 11, a V1 coil 12, a W1 coil 13, a U2 coil 14, a V2 coil 15 and a W2 coil 16 are wound about the protrusions. The U1 coil 11, the V1 coil 12 and the W1 coil 13 are connected in a Δ-shape to 10. provide a first coil set 18. The U2 coil 14, the V2 coil 15 and the W2 coil 16 are connected also in a Δ-shape to provide a second coil set 19. Each of the coil sets 18 and 19 is connected in the Δ-shape. It may however be connected in a Y-shape. A rotation angle sensor (not shown) is attached to the motor 2 for detecting a rotational position θ of the rotor. The rotation angle sensor is a resolver. It is possible to estimate the rotor rotation angle based on a voltage or a current of each phase without using the rotation angle sensor.

The motor drive apparatus 1 has an electronic control unit 3, which is configured as shown in FIG. 2 for driving the motor 2. The control unit 3 has a first inverter circuit 20 and a second inverter circuit 30, a control circuit 50, power supply relays 61 and 62 as a shut-off circuit, relay output voltage detection circuits 71 and 72, and the like. Two inverter circuits 20 and 30 are provided as two systems for power supply. In case of three or more systems, the similar configuration is added in parallel.

The first inverter circuit 20 is a three-phase inverter, in which six switching elements 21 to 26 are connected in a bridge to switch over current supply to the U1 coil 11, the V1 coil 12 and the W1 coil 13 in the first coil set 18. The switching elements 21 to 26 are metal-oxide-semiconductor field-effect transistors (MOSFETs), which are one type of field-effect transistors. The switching elements 21 to 26 are referred to as FET 21 to 26, respectively.

Drains of the three FETs 21 to 23 are connected to a power source side. Sources of the FETs 21 to 23 are connected to drains of the FETs 24 to 26, respectively. Sources of the FETs 24 to 26 are connected to the ground. A U1 junction 27 between the FET 21 and the FET 24, which are paired, is connected to one end of the U1 coil 11. A V1 junction 28 between the FET 22 and the FET 25, which are paired, is connected to one end of the V1 coil 12. A W1 junction 29 between the FET 23 and the FET 26, which are paired, is connected to one end of the W1 coil 13.

The second inverter circuit 30 is also a three-phase inverter similarly to the first inverter circuit 20. In the second inverter 30, six switching elements 31 to 36 are connected in a bridge to switch over current supply to the U2 coil 14, the V2 coil 15 and the W2 coil 16 in the second coil set 19. The switching elements 31 to 36 are also MOSFETs. The switching elements 31 to 36 are referred to as FETs 31 to 36, respectively.

Drains of the three FETs 31 to 33 are also connected to the, power source side. Sources of the FETs 31 to 33 are connected to drains of the FETs 34 to 36, respectively. Sources of the FETs 34 to 36 are connected to the ground. A U1 junction 37 between the FET 31 and the FET 34, which are paired, is connected to one end of the U2 coil 14. A V2 junction 38 between the FET 32 and the FET 35, which are paired, is connected to one end of the V2 coil 15. A W2 junction 39 between the FET 33 and the FET 36, which are paired, is connected to one end of the W2 coil 16.

Current detection circuits 48 are formed of shunt resistors and provided between the switching elements of respective phases and the ground. Detection values outputted by the current detection circuits 48 are stored in registers, which are not shown, in the control circuit 50. Detection values of the six current detection circuits 48 are acquired at the same time. The rotational position θ of the motor 2 detected by the rotation sensor is acquired also at this time.

Capacitors 49 are aluminum electrolytic capacitors, which store electric charge and supplementarily supply electric power to the FETs 21 to 26 and 31 to 36. The capacitors 49 also remove noise components such as surge current.

A battery 55 is provided as a power source and connected to the control unit 3 of the motor drive apparatus 1 through a power supply wire 56. This wire 56 is provided to supply electric power to the coil sets 18 and 19 of the motor 2. The battery 55 supplies power to the first coil set 18 of the motor 2 through the first power supply relay 61 and the first inverter circuit 20. The battery 55 also supplies power to the second coil set 19 of the motor 2 through the second power supply relay 62 and the second inverter circuit 30.

The first power supply relay 61 is provided between the battery 55 and the first inverter circuit 20. The second power supply relay 62 is provided between the battery 55 and the second inverter circuit 30. The power supply relays 61 and 62 are formed of MOSFETs similarly to the switching elements 21 to 26 and 31 to 36. The power supply relays 61 and 62 are power supply shut-off circuits for shutting off power supply from the battery 20 to the inverter circuits 20 and 30, when abnormality arises in the inverter circuits 20, 30, a pre-driver 52 or the like.

A first voltage application circuit 65 is a part, which applies a voltage to the first coil set 18 without passing through the first inverter circuit 20. A second voltage application circuit 66 is also a part, which applies a voltage to the second coil set 19 without passing through the second inverter circuit 30. The first voltage application circuit 65 and the second voltage application circuit 66 are formed of pull-up resistors, respectively. The pull-up resistor has a resistance, which is equal to a sum of resistances of two voltage dividing resistors forming each terminal voltage detection circuit 80.

A first relay output voltage detection circuit 71 is provided at the motor 2 side of the first power supply relay 61 and detects a relay output voltage (referred to as a first relay output voltage) VPIG1, which is developed at the output side of the first power supply relay 61. Similarly, a second relay output voltage detection circuit 72 is provided at the motor 2 side of the second power supply relay 62 and detects a relay output voltage (referred to as a second relay output voltage) VPIG2, which is developed at the output side of the second power supply relay 61. Each of the relay output voltage detection circuits 71 and 72 is formed of two voltage dividing resistors having the same resistance. The control circuit 50 acquires a voltage value outputted at a midpoint of the two voltage dividing resistors of each of the voltage detection circuits 71 and 72 and calculates the relay output voltage by AD conversion.

A power source voltage detection circuit 73 is provided between the battery 55 and the control circuit 50. The power source voltage detection circuit 73 is formed of two voltage dividing resistors having the same resistance. The control circuit 50 acquires a voltage value outputted at a midpoint of two voltage dividing resistors of the power source voltage detection circuit 73 and detects a power source line voltage VIG by A/D conversion.

Terminal voltage detection circuits 80 detect voltages applied to the U1 coil 11, the V1 coil 12, the W1 coil 13, the U2 coil 14, the V2 coil 15 and the W2 coil 16. The terminal voltage detection circuit 80 is provided in correspondence to each junction between a high-side FET (for example FET 21), a low-side FET (for example FET24) and a coil (for example coil 11) of each phase of the motor 2. Each circuit 80 for each phase is formed of two voltage dividing resistors having the same resistance. The control circuit 50 acquires a voltage value developed at the midpoint of the two voltage dividing resistors through a low-pass filter (not shown), and calculates a terminal voltage of each coil terminal by AD conversion.

A U1 terminal voltage MVU1, a V1 terminal voltage MVV1 and a W1 terminal voltage MVW1, which are terminal voltages of the U1 coil 11, the V1 coil 12 and the W1 coil 13, respectively, normally vary between 0 V and the first relay output voltage VPIG1. Similarly, a U2 terminal voltage MVU2, a V2 terminal voltage MVV2 and a W2 terminal voltage MVW2, which are terminal voltages of the U2 coil 14, the V2 coil 15 and the W2 coil 16, respectively, normally vary between 0 V and the second relay output voltage VPIG2.

The control circuit 50 is for controlling entirety of the motor drive apparatus 1 and formed of a programmed microcomputer. The control circuit 50 controls currents supplied to the coils 11 to 16 of the motor 2 by controlling turn-on (conduction) and turn-off (non-conduction) of the FETs 21 to 26 and 31 to 36 through the pre-driver 52 based on detection values outputted by the current detection circuits 48 and the rotational position θ of the rotor detected by the rotation angle sensor. Thus, rotation of the motor 2 is controlled. The pre-driver 52 according to the first embodiment is formed of a charge pump circuit. In FIG. 2, control lines from the control circuit 50 and the pre-driver 52 are not shown for brevity. The control circuit 50 performs failure check processing, which checks failure of the first power supply relay 61 and the second power supply relay 62 as well as wire-break failure between the battery 55 and the power supply relays 61 and 62.

Figure 3:
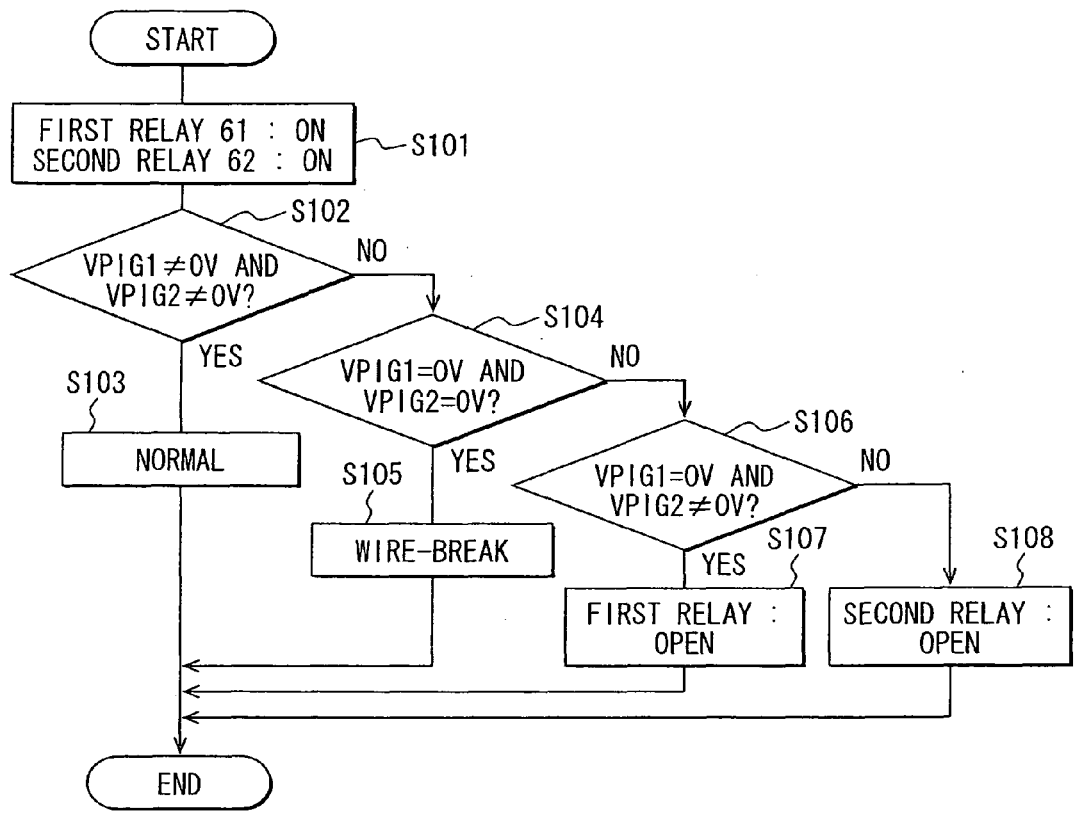
FIG. 3 is a flowchart of failure check processing according to the first embodiment of the present invention.

The failure check processing performed by the control circuit 50 is described with reference to a flowchart shown in FIG. 3 on condition that the inverter circuits 20 and 30 are provided as two systems. The processing shown in FIG. 3 is performed after determining that a short-circuit failure, which disables shut-off of power supply from the battery 55 side to the first inverter circuit 20 side, is not present in the first power supply relay 61 and that a short-circuit failure, which disables shut-off of power supply from the battery 55 side to the second inverter circuit 30 side, is not present either in the second power supply relay 62.

At first step S101 (step is indicated simply as S hereunder), the first power supply relay 61 and the second power supply relay 62 are controlled to turn on. Specifically, gate voltages are applied to the gates of the power supply relays 61 and 62. The power supply relays 61 and 62 controlled to conduct at this step corresponds to a conduction control shut-off circuit.

It is checked at S102 whether the first relay output voltage VPG1 is different from 0 V (not 0V) and the second relay output voltage VPG2 is also different from 0 V. It is determined that power is supplied to the motor 2 side from the first power supply relay 61, when the first power relay output voltage VPIG1 is different from 0 V. It is determined that power is not supplied to the motor 2 side from the first power supply relay 61, when the first power relay output voltage VPIG1 is 0 V. Similarly, it is determined that power is supplied to the motor 2 side from the second power supply relay 61, when the second power relay output voltage VPIG2 is different from 0 V. It is determined that power is not supplied to the motor 2 side from the second power supply relay 61, when the second power relay output voltage VPIG2 is 0 V. If it is determined that at least one of the relay output voltages VPIG1 and VPIG2 is 0V (S102:NO), S104 is executed. If it is determined that both of the relay output voltages VPIG1 and VPIG2 are different from 0V (S102:YES), S103 is executed.

It is determined at S103 that the wire 56 between the battery 55 and the power supply relays 61 and 62 is not broken. It is further determined that the open-failure, which disables the power supply relays 61 and 62 to conduct, is not present and that the power supply relays 61 and 62 are normal.

At S104, which is executed if it is determined that at least one of the relay output voltages VPIG1 and VPIG2 is determined to be 0 V (S102:NO), it is checked whether the first relay output voltage VPIG1 is 0 V and the second relay output voltage VPIG2 is 0 V. If it is determined that one of the relay output voltages VPIG1 and VPIG2 is not 0 V (S104:NO), S106 is executed. If it is determined that both of the relay output voltages VPIG1 and VPIG2 are 0 V (S104:YES), S105 is executed. It is determined at S105 that the wire 56 between the battery 55 and the power supply relays 61 and 62 is broken.

At S106, which is executed if it is determined that one of the relay output voltages VPIG1 and VPIG2 is not 0 V (S104:NO), it is checked whether the first relay output voltage VPIG1 is 0 V and the second relay output voltage VPIG2 is different from 0 V (not 0 V). If the first relay output voltage VPIG1 is not 0 V and the second relay output voltage VPIG2 is 0 V (S106:NO), S108 is executed. If the first relay output voltage VPIG1 is 0 V and the second relay output voltage VPIG2 is different from 0 V (S106:YES), S107 is executed.

It is determined at S107 that open-failure, which disables the first power supply relay 61 to conduct, is present in the first power supply relay 61. At S108, which is executed if it is determined that the first relay output voltage VPIG1 is not 0 V and the second relay output voltage VPIG2 is 0 V (S106:NO), it is determined that open-failure, which disables conduction of the second power supply relay 62, is present in the second power supply relay 61.

The motor drive apparatus 1 provides the following advantages as described below.

(1) If it is determined (S104:YES) that electric power is not supplied to the motor 2 side from the first power supply relay 61 and the second power supply relay 62, which are controlled to conduct, at the time when the power supply relays 61 and 62 are controlled to conduct (S101), it is determined that the wire 56 between the battery 55 and the power supply relays 61 and 62 is broken. That is, it is determined that the power supply relays 61 and 62 have no failure but the wire 56 is broken (S105). Thus, location of the failure can be specified accurately. In this instance, it is only necessary to replace the wire 56, which connects the battery 55 and the control unit 3 including the first power supply relay 61 and the second power supply relay 62. It is not necessary to disassemble the motor drive apparatus 1 for detailed inspection. Man-hour required for specifying the location of failure can be reduced. According to the first embodiment, the location of failure is specified based on the relay output voltages VPIG1. and VPIG2 under a condition that the power supply relays 61 and 62 are controlled to conduct. Therefore failure determination can be performed in a short time. The failure location can thus be specified speedily.

(2) If it is not determined (S104:NO) that the wire 56 from the battery 55 to the first power supply relay 61 and the second power supply relay 62 is not broken under a condition (S102:YES) that power is not supplied to the motor 2 side from the power supply relays 61 and 62, it is determined that the open-failure, which disables conduction, is present in the power supply relay 61 or 62, which is determined to be incapable of supplying power to the motor 2 side (S106 to S108). Thus, it can be determined accurately that the open-failure, which disables the power supply relays 61 and 62 to conduct, is present in the power supply relays 61 and 62.

(3) If power is not supplied to the motor 2 side from all the power supply relays 61 and 62, which are controlled to conduct, it is determined that the wire 56 between the battery 55 and the power supply relays 61 and 62 is broken. There are two power supply relays 61 and 62, which are controlled to conduct. If electric power is not supplied to the motor 2 side from more than one-half of relays controlled to conduct, that is, two power supply relays, such a situation is considered to indicate that the wire 56 between the battery 55 and the power supply relays 61 and 62 is broken.

(4) The motor drive apparatus 1 is applied to the electric power steering system 100. Safety measure need be taken, when failure is detected in the EPS system. If it is not possible to specify whether the failure is of the wire 56 or of the control unit 3, the wire 56 and the motor drive apparatus 1 are replaced. However, it is possible to check whether the failure is a wire-break of the wire 56 between the battery 55 and the power supply relays 61 and 62 or open-failure of the power supply relay 61 or 62. In some vehicles, component parts are not arranged to enable easy repair such as replacement work of failure parts. By accurately specifying the location of failure as in the first embodiment, the replacement work of failure parts can be reduced.

According to the first embodiment, the control circuit 50 operates as a switching control part, a conduction state check part, and a wire-break determination part. Further, in FIG. 3, S101 corresponds to a function of the switching control part. S102, S104 and S106 correspond to a function of the conduction state check part. S105 corresponds to a function of the wire-break determination part. S107 and S108 correspond to a function of the open-failure determination part.

(Second Embodiment)

A motor drive apparatus according to a second embodiment of the present invention is described with reference to FIG. 4 to FIG. 7. The second embodiment is different from the first embodiment in failure check processing. That is, although the failure check processing is described with respect to a case, in which two systems of inverter circuits are provided in the first embodiment, the failure check processing according to the second embodiment is described in case of more than two systems of inverter circuits. Since the entire configuration of the motor drive apparatus 1 is similar to that of the first embodiment except for a multiple systems of inverter circuits, same description is omitted. A relay output voltage of a N-th system is denoted as VPIG[N] in correspondence to the first embodiment, in which the first relay output voltage developed at the output side of the first power supply relay 61 is denoted as VPIG1. Similarly, flags or the like, which are set for each of a plurality of systems in the following processing, are also denoted as Fs[N], for example, by attaching [N] at the end. Assuming that a total number of systems of inverter circuits is M, integer numbers from 1 to M are attached as system numbers. Since a power supply relay is provided in each of inverter circuits, as many as M units of power supply relays including the power supply relays 61 and 62 shown in FIG. 2 are provided.

Figure 4:
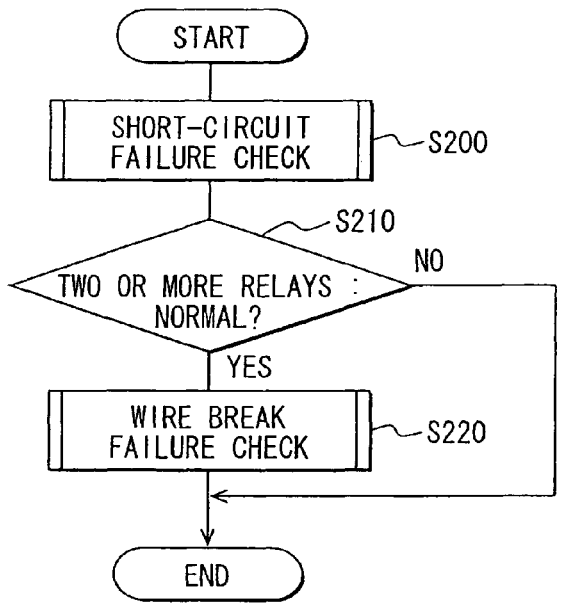
FIG. 4 is a flowchart of failure check processing according to a second embodiment of the present invention.
Figure 5:
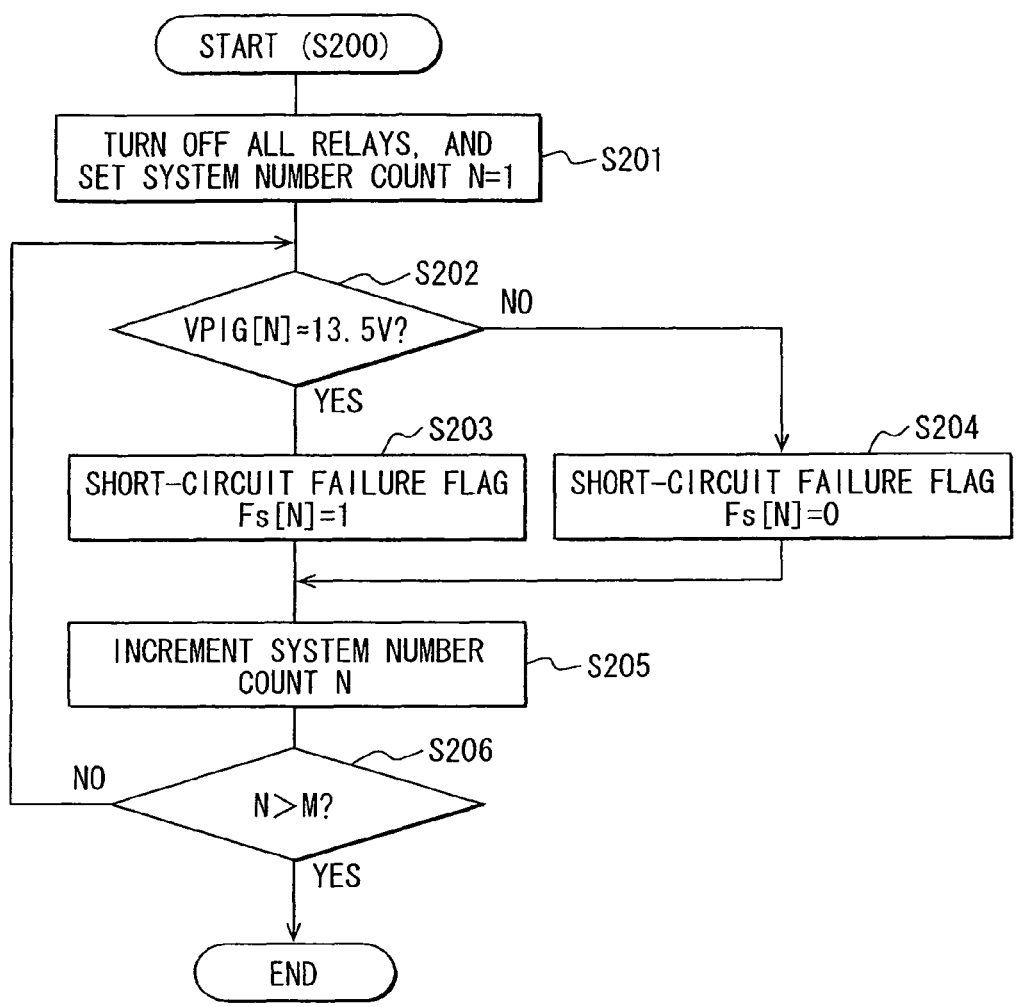
FIG. 5 is a flowchart of short-circuit failure check processing according to the second embodiment of the present invention.

According to the second embodiment, the control circuit 50 of the control unit 3 performs the failure check processing shown in FIG. 4.

At first S200, short-circuit failure check processing is executed to check whether a short-circuit failure is present in the power supply relays. The short-circuit failure check processing is described with reference to FIG. 5. At S201, all the power supply relays are controlled to turn off. A system number count N of a counter is initialized to N=1.

It is checked at S202 whether a relay output voltage VPIG[N] of the N-th system is generally equal to a battery voltage of the battery 55. Assuming that the battery voltage is 13.5 V, it is determined that the relay output voltage VPIG[N] is generally equal to the battery voltage when the relay output voltage VPIG[N] is equal to or greater than a predetermined value, for example, 13 V. If it is determined that the relay output voltage VPIG[N] of the N-th system is generally equal to the battery voltage (S202:YES), S203 is executed. If it is determined that the relay output voltage VPIG[N] of the N-th system is not generally equal to the battery voltage (S202: NO), that is, it is determined that the relay output voltage VPIG[N] of the N-th system is less than the battery voltage, S204 is executed.

At S203, which is executed if it is determined that the relay output voltage VPIG[N] of the N-th system is generally equal to the battery voltage (S202:YES), it is determined that a short-circuit failure, which disables the power supply relay of the N-th system to shut off power supply from the battery 55 side to the inverter circuit side, is present. The short-circuit failure flag Fs[N]=1 of the N-th system is set. At S204, which is executed if it is determined that the relay output voltage VPIG[N] of the N-th system is not generally equal to the battery voltage (S202:NO), it is determined that a short-circuit failure, which disables the power supply relay of the N-th system to shut off power supply from the battery 55 side to the inverter circuit side, is not present. The short-circuit failure flag Fs[N] of the N-th system is not set but is reset to Fs[N]=0.

At S205, the system number count N is incremented. At S206, it is checked whether the system number count N is greater than the total number of systems M. If it is determined that the system number count N is equal to or less than the total number M (S206:NO), S202 is executed again. That is, by repeating execution of processing S202 to S205 same number of times as the total number of systems M, it is checked whether the short-circuit failure is present with respect to each of the power supply relays provided in the systems of inverter circuits, respectively. If it is determined that the system number count N is greater than the total number of the systems M (S206:YES), the short-circuit check processing is completed.

Referring to FIG. 4 again, it is checked at S210, which is executed after the short-circuit failure check processing (S200), whether there are two or more number of systems, which have respective power supply relays having no short-circuit. This check processing is performed by checking whether there are two or more systems, for which the short-circuit flag Fs is not set, that is, Fs[N]=0. If it is determined that there are less than two systems, that is, one system having no short-circuit in the power supply relay (S210:NO), the failure check processing is completed without executing S220. If it is determined that there are two or more systems, which have no short-circuit in the respective power supply relays (S210:YES), S220 is executed.

Figure 6:
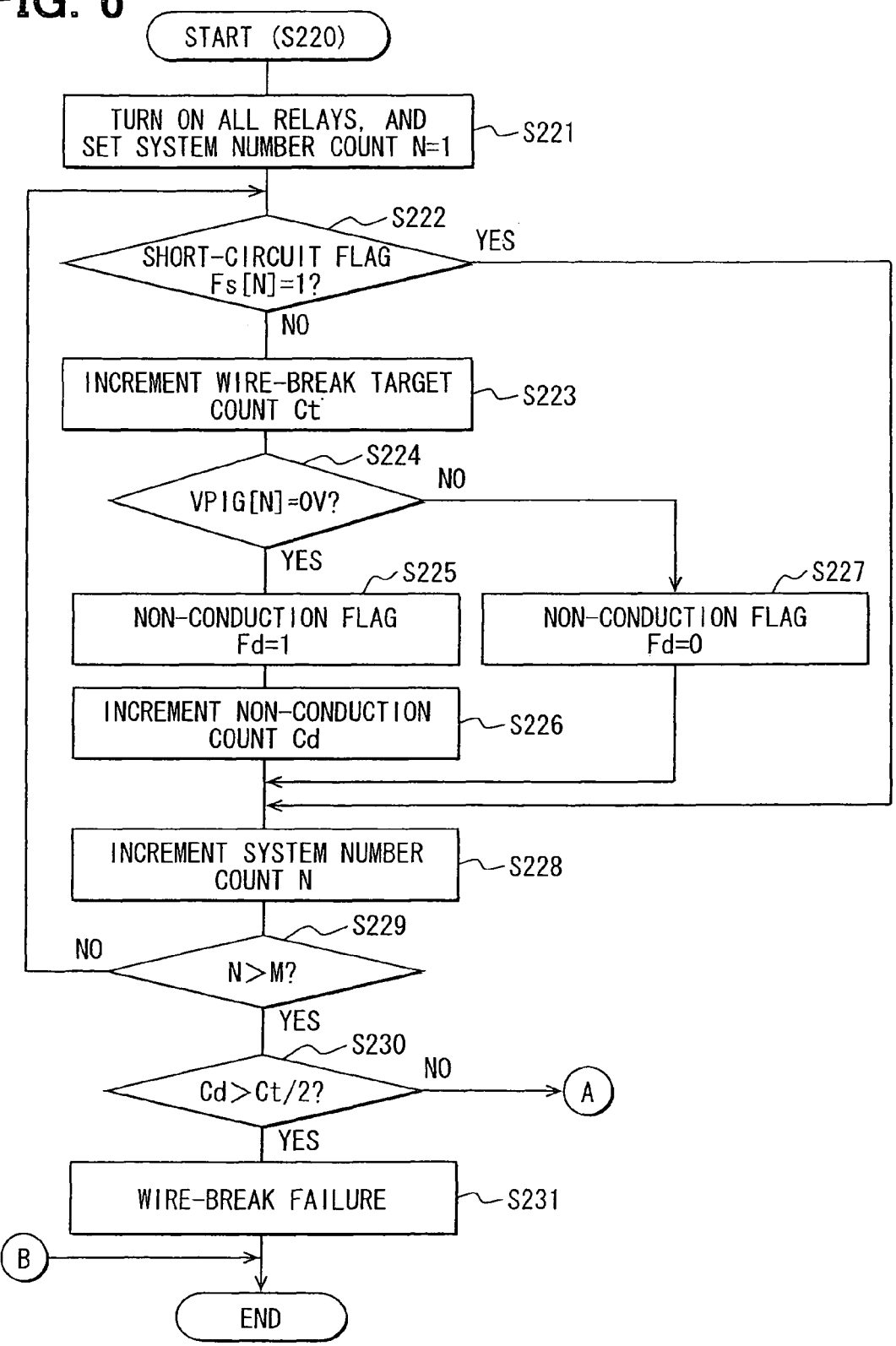
FIG. 6 is a flowchart of wire-break failure check processing according to the second embodiment of the present invention.
Figure 7:
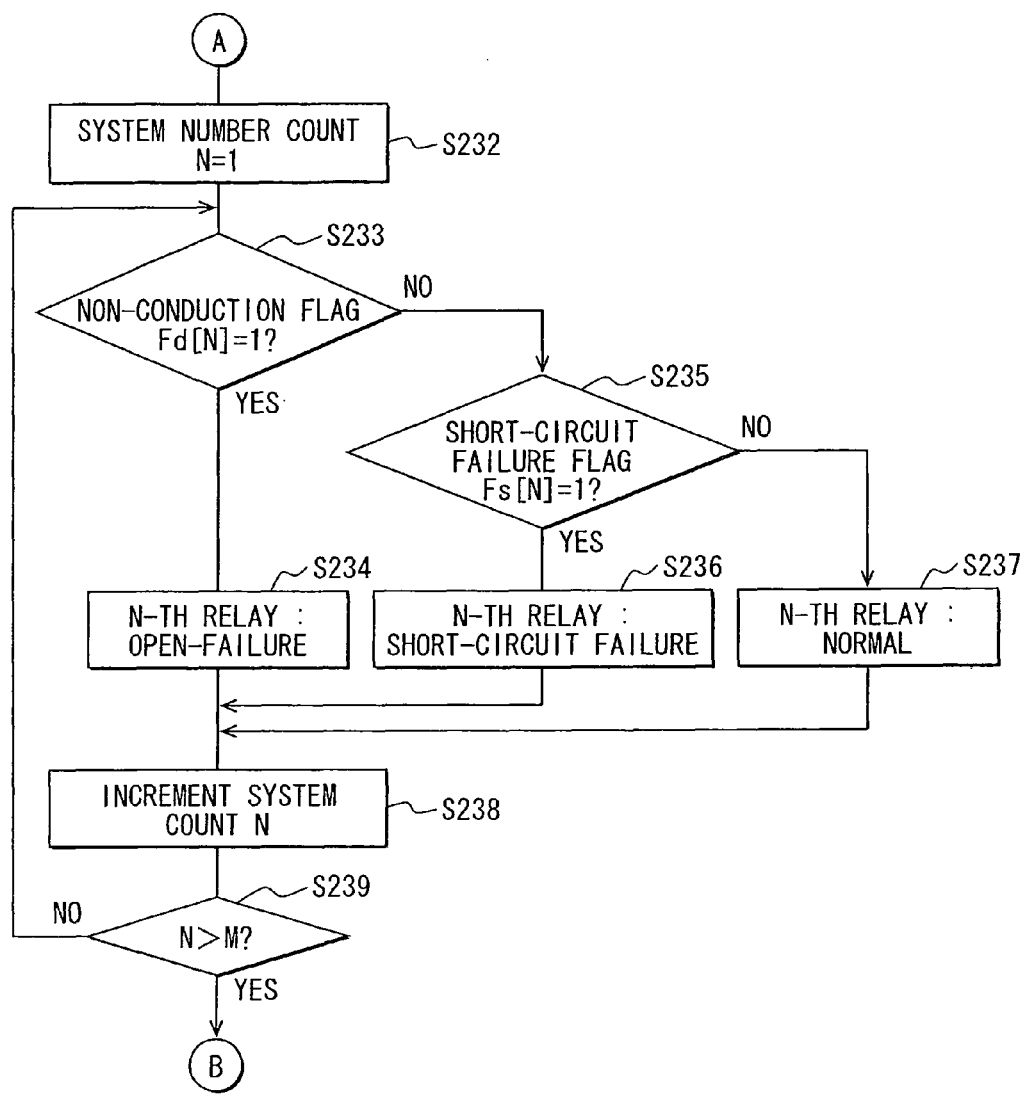
FIG. 7 is a flowchart of the wire-break failure check processing according to the second embodiment of the present invention.

At S220, wire-break failure check processing is performed as shown in FIG. 6 and FIG. 7. At S221, all the power supply relays are controlled to turn on. The system number of count N is initialized to N=1. Since all the power supply relays are controlled to turn on, all the power supply relays controlled to turn on correspond conduction control shut-off circuit.

At S222, it is checked whether the short-circuit failure flag Fs[N] of the N-th system is set. If the short-circuit failure flag Fs[N] is set (S222:YES), that is, Fs[N]=1, S228 is executed without executing S223 to S227. At S223, a wire-break check target count Ct is incremented. That is, if the determination of S222 is YES, the wire-break check subject count Ct is not incremented and is removed from the wire-break check target.

It is checked at S224 whether the relay output voltage VPIG[N] of the N-th system is generally 0 V. For example, it can be determined that the relay output voltage VPIG[N] of the n-th system is generally 0 V, if the relay output voltage VPIG[N] of the N-th system is less than a sufficiently small predetermined threshold value. Similarly to the first embodiment, it is determined that power is not supplied to the motor 2 side from the power supply relay of the N-th system, if the relay output voltage VPIG[N] is generally 0 V. It is determined that power is supplied to the motor 2 side from the power supply relay of the N-th system, if the relay output voltage VPIG[N] is not generally 0 V. If it is determined that the relay output voltage VPIG[N] of the N-th system is not generally 0 V (S224:NO), S227 is executed. If it is determined that the relay output voltage VPIG[N] of the N-th system is generally 0 V (S224:YES), S225 is executed.

At S225, a non-conduction flag of the N-th system is set to Fd[N]=1. At S226, a non-conduction count Cd is incremented. At S227, which is executed if it is determined that the relay output voltage VPIG[N] of the N-th system is not generally 0 V (S224:NO), the non-conduction flag Fd[N] is not set and reset to Fd[N]=0.

At S228, the system number count N is incremented. At S229, it is checked whether the system number count N is greater than the total number of systems M. If it is determined that the system count Number N is less than the total number of system counts M (S229:NO), S222 is executed. That is, the processing of S222 to S228 is repetitively executed a number of times corresponding to the total number of systems M so that the power supply relay output conduction state is specified with respect to each of the systems. If it is determined that the system count Number N is greater than the total system number M (S229:YES), S230 is executed.

At S230, it is checked whether the non-conduction count Cd is greater than one-half of the wire-break check target count Ct. If it is determined that the non-conduction count Cd is less than one-half of the wire-break check target count Ct (S230:NO), that is, Cd≦Ct/2, S232 of FIG. 7 is executed. If the non-conduction count Cd is greater than one-half of the wire-break check target counter Ct (S230:YES), that is, Cd>Ct/2, S231 is executed. At S231, it is determined that the wire 56 between the power supply relay and the battery 55 is broken.

As shown in FIG. 7, at S232, which is executed if the non-conduction count Cd is equal to or less than the wire-break check target count Ct (S230:NO), the system number count N is initialized to N=1. At S233, it is checked whether the non-conduction flag Fd[N] of the N-th system is set. If the non-conduction flag Fd[N] is not set (S233:NO), that is, Fd[N]=0, S235 is executed. If the non-conduction flag Fd[N] is set (S233:YES), that is, Fd[N]=1, S234 is executed. At S234, it is determined that the open-failure, which disables the power supply relay to turn on, is present in the power supply relay of the N-th system.

At S235, which is executed if the non-conduction flag Fd[N] of the N-th system is not set (S233:NO), it is checked whether the short-circuit flag Fs[N] of the N-th system is set. If the short-circuit failure flag Fs[N] of the N-th system is not set (S235:NO), that is, Fs[N]=0, S236 is executed. If the short-circuit failure Fs[N] of the N-th system is set (S235:YES), that is, Fs[N]=1, S236 is executed.

At S236, it is determined that the short-circuit failure, which disables power supply from the battery 55 to the inverter circuit side, is present in the power supply. relay of the N-th system. At S237, which is executed if the short-circuit failure flag Fs[N] of the N-th system is not set (S235:NO), it is determined that the power supply relay of the N-th system is normal.

At S238, the system number count N is incremented. It is checked at S239 whether the system number count N is greater than the total system number M. If it is determined that the system number count N is determined to equal to or less than the total system count M (S239:NO), S233 is executed. That is, the processing of S233 to S237 is repetitively executed a number of times, which corresponds to the total number of systems so that the failure check is performed with respect to each of the power supply relays. If it is determined that the system number count N is greater than the total system number M (S239:YES), the foregoing processing is completed.

Thus, the second embodiment provides the similar advantages as (1), (2) and (4) of the first embodiment.

In addition, it is checked whether the short-circuit failure, which disables shut-off of the power supply from the battery 55 side to the inverter circuit side, is present in the power supply relay with respect to each of the power supply relays (S202 to S204). The power supply relay, which has the short-circuit failure, is removed from target of check processing performed to determine the wire-break of the wire 56 between the battery 55 and the power supply relays (S222, S223). Thus, it is possible to lower probability of erroneous determination of the failure location and to determine more accurately the wire-break of the wire between the battery 55 and the power supply relays.

It is determined that the wire 56 between the power supply relays and the battery 55 is broken (S231), if the power is not supplied to the motor 2 side from the power supply relay (S230:YES) in more than one-half of the power supply relays, which are controlled to turn on and the wire-break check targets excluding the power supply relay having the short-circuit failure. Thus, it is possible to accurately determine that the wire 56 between the power supply relay and the battery 55 is broken. The wire-break check target count Ct and the non-conduction count Cd are integers. Therefore, if the count value Ct of the wire-break check target count is odd, Ct/2 corresponds to a predetermined number. If the count Ct of the wire-break check target counter is even, Ct/2+1 corresponds to a predetermined number.

The control circuit 50 corresponds to a switching control part, a conduction state check part, a wire-break determination part, a removal part and an open-failure determination part. S201 of FIG. 5 and S221 of FIG. 6 correspond to a function of the switching control part, S202 and S224 correspond to a function of the conduction state check part, S231 corresponds to a function of the wire-break failure determination part, S203 and S236 of FIG. 7 correspond to function of the short-circuit failure determination part, S222 and S223 correspond to a function of the removal part, and S234 corresponds to a function of the open-failure determination part.

Other Embodiments

According to the foregoing embodiment, it is determined that power is not supplied to the motor side from the power supply relays, if the relay output voltage is generally 0 V at the time of controlling the power supply relay to turn on. Alternatively, it is possible to determine that power is not supplied to the motor side from the power supply relays, if the relay output voltage is less than a predetermined voltage value at the time of controlling the power supply relay to turn on. The predetermined voltage value may be set in correspondence to, for example, the battery voltage or a pre-charge voltage.

According to the foregoing embodiment, it is checked whether the power is supplied to the motor side from the power supply relay side based on the relay output voltage value detected by the relay output voltage detection circuit. Alternatively, it is possible to check whether the power is supplied to the motor side from the power supply relay side based on the terminal voltage value detected by the terminal voltage detection circuit. It is also possible to check whether the power is supplied to the motor side from the power supply relay based on a current value in place of the voltage value. It is further possible to check whether the power is supplied to the motor side from the power supply relay based on a current detected by current detection circuit, which detects a current supplied to the coils, for example, shunt resistors in the foregoing embodiment.

According to the foregoing embodiment, it is checked whether the power is supplied to the motor side from the power supply relay by controlling all the power supply relays to turn on. That is, all the power supply relays correspond to the conduction control shut-off circuit. It is however not necessary to control all the power supply relays to turn on as long as a plurality of power supply relays are controlled to turn on. In this instance, only the power supply relays controlled to turn on correspond to the conduction control shut-off circuit. For example, it is possible to remove a power supply relay having a short-circuit failure from power supply relays, which are checked with respect to wire-break, by not controlling it to turn on.

The threshold value, that is, a predetermined number, which is used to check whether the wire has the wire-break failure or the power supply relay itself has the open-failure, is not limited to more than one-half or all of the power supply relays, which are targets to be checked with respect to wire-break. The threshold value may be any value, which is two or more not exceeding the number of power supply relays to be checked with respect to the wire-break. For example, the predetermined number may be set to a value, which is a product of ⅔ and the number of the power supply relays. The predetermined number may also be two, for example, as far as the open-failure do not arise in the two power supply relays at the same time.

According to the foregoing embodiment, the voltage application circuit is provided to apply a voltage to the coil set of the motor without passing through the inverter circuit. The voltage application circuit may however be eliminated. A filter circuit may be provided between the battery and the power supply relays to reduce noises. The filter circuit may be formed of a radio noise coil and a power smoothing capacitor, for example. In case that a capacitor is used in the filter circuit, it preferably has smaller capacitance than a capacitor, which is provided in the inverter circuit.

According to the foregoing embodiment, MOSFETs are used as the switching elements and the power supply relays. However, any other elements may be used as far as they are capable of switching over conduction and shut-off of current. Although the motor drive apparatus 1 has the motor 2 and the control unit 3 for controlling drive of the motor 2, the control unit 3 may be understood as the motor drive apparatus. Although the motor drive apparatus is used in the electric power steering system, the motor drive apparatus may be used in other than EPS, for example, a hybrid apparatus, a power window.

The present invention is not limited to the foregoing embodiments, but may be implemented in many other embodiments.

What is claimed is:

1. A motor drive apparatus for driving a motor having a plurality of coil sets, the motor drive apparatus comprising:
   a plurality of inverter circuits provided for each of the coil sets for supplying electric power from a power source to the coil sets;
   a plurality of shut-off circuits connected to the power source through a power supply wire and to the inverter circuits for shutting off the power supply from a power source side to inverter circuit sides; and
   a control circuit including a switching control part, a conduction state check part and a wire-break determination part,
   the switching control part controlling switching-over of conduction and shut-off of the shut-off circuits,
   the conduction state check part checking whether the power is supplied to a motor side from shut-off circuits side with respect to each of the shut-off circuits, and
   the wire-break determination part determining that the wire between the power source and the shut-off circuits is broken, if more than a predetermined number of the shut-off circuits are determined to fail to supply power to the motor side, when the plurality of shut-off circuits are controlled to turn on by the switching control part.

2. The motor drive apparatus according to claim 1, wherein the control circuit further includes:
   a short-circuit failure determination part that determines with respect to each of the shut-off circuits whether a shot-circuit failure, which disables shut-off of the power supply from the power source side to the inverter circuits side, is present; and
   a removal part that removes the shut-off circuit, which is determined to have the short-circuit failure by the short-circuit failure determination part, from the shut-off circuits, which are checked by the wire-break determination part whether the wire between the power source and the shut-off circuits is broken.

3. The motor drive apparatus according to claim 1, wherein the control circuit further includes:
   an open-failure determination part that determines that an open-failure, which disables conduction of the shut-off circuits determined as not supplying the power to the motor side by the conduction state check part, when the wire-break determination part determines no wire-break of the wire between the power source and the shut-off circuits under a condition that the conduction state check part determines that no power is supplied from at least one of the shut-off circuits to the motor side.

4. The motor drive apparatus according to claim 1, wherein:
   the predetermined number is more than one-half of the shut-off circuits, which are controlled to turn on by the switching control part.

5. The motor drive apparatus according to claim 1, wherein:
   the predetermined number is a total number of all the shut-off circuits, which are controlled to turn on by the switching control part.

6. An electric power steering system comprising:
   the motor drive apparatus according to claim 1.

* * * * *